(12) United States Patent
Eendebak et al.

(10) Patent No.: US 10,872,956 B2
(45) Date of Patent: Dec. 22, 2020

(54) QUANTUM DOT CIRCUIT AND A METHOD OF CHARACTERIZING SUCH A CIRCUIT

(71) Applicants: Nederlandse Organisatie voor toegepast-natuurwetenschappelijk onderzoek TNO, 's Gravenhage (NL); Technische Universiteit Delft, Delft (NL)

(72) Inventors: Pieter Thijs Eendebak, Utrecht (NL); Timothy Alexander Baart, Amstelveen (NL); Lieven Mark Koenraad Vandersypen, Delft (NL)

(73) Assignees: Nederlandse Organisatie voor toegepast-natuurwetenschappelijk onderzoek TNO, 's-Gravenhage (NL); Technische Universiteit Delft, Delft (NL)

( * ) Notice: Subject to any disclaimer, the term of this patent is extended or adjusted under 35 U.S.C. 154(b) by 135 days.

(21) Appl. No.: 16/081,609

(22) PCT Filed: Mar. 6, 2017

(86) PCT No.: PCT/NL2017/050132
§ 371 (c)(1),
(2) Date: Aug. 31, 2018

(87) PCT Pub. No.: WO2017/150980
PCT Pub. Date: Sep. 8, 2017

(65) Prior Publication Data
US 2020/0127096 A1    Apr. 23, 2020

(30) Foreign Application Priority Data
Mar. 4, 2016    (EP) .................................... 16158810

(51) Int. Cl.
*H01L 29/12*    (2006.01)
*G06N 10/00*    (2019.01)
(Continued)

(52) U.S. Cl.
CPC ............ *H01L 29/127* (2013.01); *G06F 30/20* (2020.01); *G06N 10/00* (2019.01); *H01L 29/7613* (2013.01)

(58) Field of Classification Search
None
See application file for complete search history.

(56) References Cited

U.S. PATENT DOCUMENTS

| 5,889,288 A | * | 3/1999 | Futatsugi | ............... | B82Y 10/00 257/17 |
| 5,937,295 A | * | 8/1999 | Chen | ...................... | B82Y 10/00 438/257 |

(Continued)

FOREIGN PATENT DOCUMENTS

| EP | 1860600 A1 | 11/2007 |
| EP | 2075745 A1 | 7/2009 |

OTHER PUBLICATIONS

Nov. 10, 2010—Wild, A. et al "Electrostatically defined quantum dots in Si/SiGe heterostructure" New Journal of Physics v. 12 pp. 1-16.

(Continued)

*Primary Examiner* — Lincoln D Donovan
*Assistant Examiner* — Khareem E Almo
(74) *Attorney, Agent, or Firm* — Banner & Witcoff, Ltd.

(57) ABSTRACT

Quantum dot circuit and a method of characterizing such a circuit Voltages that enable control of electron occupation in a series of quantum dots are determined by a method of measuring effects of gate electrode voltages on a quantum dot circuit. The quantum dot circuit comprises a channel (Continued)

(10), first gate electrodes (14a-14e) that extend over locations along the edge of the channel to create potentials barriers defining the potentials well therebetween, as well as second gate electrodes (16a-16d) adjacent to potential wells, for controlling depths of the successive electrical potential wells between the potential barriers. First, channel currents are measured in a pre-scan of bias voltages of the first gates for controlling the potential barriers. The result is used to set their bias levels in, a scan over a two-dimensional range of combinations of bias voltages on the second gates for controlling the depths. In this scan an indication of charge carrier occupation of potential wells at consecutive positions along the channel such as electromagnetic wave reflection is measured. Pattern matching with a pattern of crossing occupation edges is applied to the result. This involves a two-dimensional image that has the combinations of the bias voltages as image points and the indication of charge carrier occupation as image values. The pattern matching detects an image point where the image matches a pattern of crossing edges along predetermined directions.

17 Claims, 5 Drawing Sheets

(51) Int. Cl.
  *G06F 30/20* (2020.01)
  *H01L 29/76* (2006.01)

(56) References Cited

U.S. PATENT DOCUMENTS

| | | | | |
|---|---|---|---|---|
| 6,333,516 B1 * | 12/2001 | Katoh | | H01L 29/66977 257/22 |
| 6,515,339 B2 * | 2/2003 | Shin | | B82Y 10/00 257/24 |
| 6,597,010 B2 * | 7/2003 | Eriksson | | B82Y 10/00 257/14 |
| 6,635,898 B2 * | 10/2003 | Williams | | G06N 10/00 257/14 |
| 7,026,641 B2 * | 4/2006 | Mohseni | | B82Y 10/00 257/14 |
| 7,135,697 B2 * | 11/2006 | Friesen | | B82Y 10/00 257/14 |
| 7,364,923 B2 * | 4/2008 | Lidar | | B82Y 10/00 438/17 |
| 7,659,538 B2 * | 2/2010 | Snyder | | B82Y 20/00 257/24 |
| 7,830,695 B1 * | 11/2010 | Moon | | G11C 11/44 365/106 |
| 7,923,801 B2 * | 4/2011 | Tian | | H01L 27/14603 257/440 |
| 8,043,978 B2 * | 10/2011 | Miyazaki | | B82Y 10/00 438/768 |
| 8,164,082 B2 * | 4/2012 | Friesen | | G06N 10/00 257/9 |
| 8,507,894 B2 * | 8/2013 | Morello | | H01L 29/66984 257/30 |
| 8,525,287 B2 * | 9/2013 | Tian | | H01L 27/14603 257/440 |
| 9,153,594 B2 * | 10/2015 | Jain | | G11C 11/56 |
| 9,747,752 B2 * | 8/2017 | Homer | | G07F 17/326 |
| 2015/0279981 A1 | 10/2015 | Eriksson et al. | | |

OTHER PUBLICATIONS

Mar. 3, 2016—Knapp, T.J. et al, "Characterization of a gate-defined double quantum dot in a Si/SiGe nanostructure", IOP Publishing, Nanotechnology 27 (2016) pp. 1-8.
2013—Li, Hai-Ou "Chapter 6 Quantum Transport in Graphene Quantum Dots" INTECH New Progress on Graphene Research pp. 161-184 http://dx.doi.org/10.5772/52873.
Jul. 4, 2017—PCT/NL2017/050132—ISR and WO.

* cited by examiner

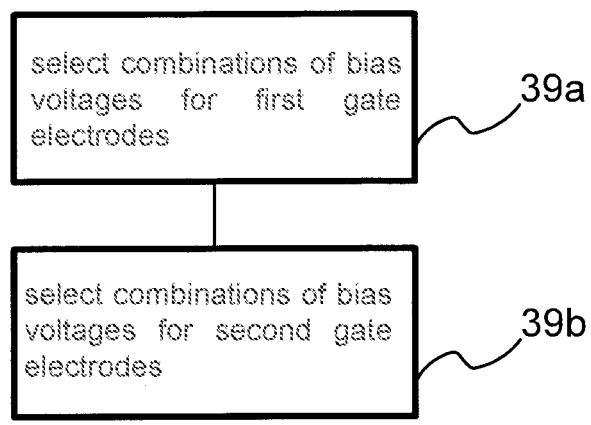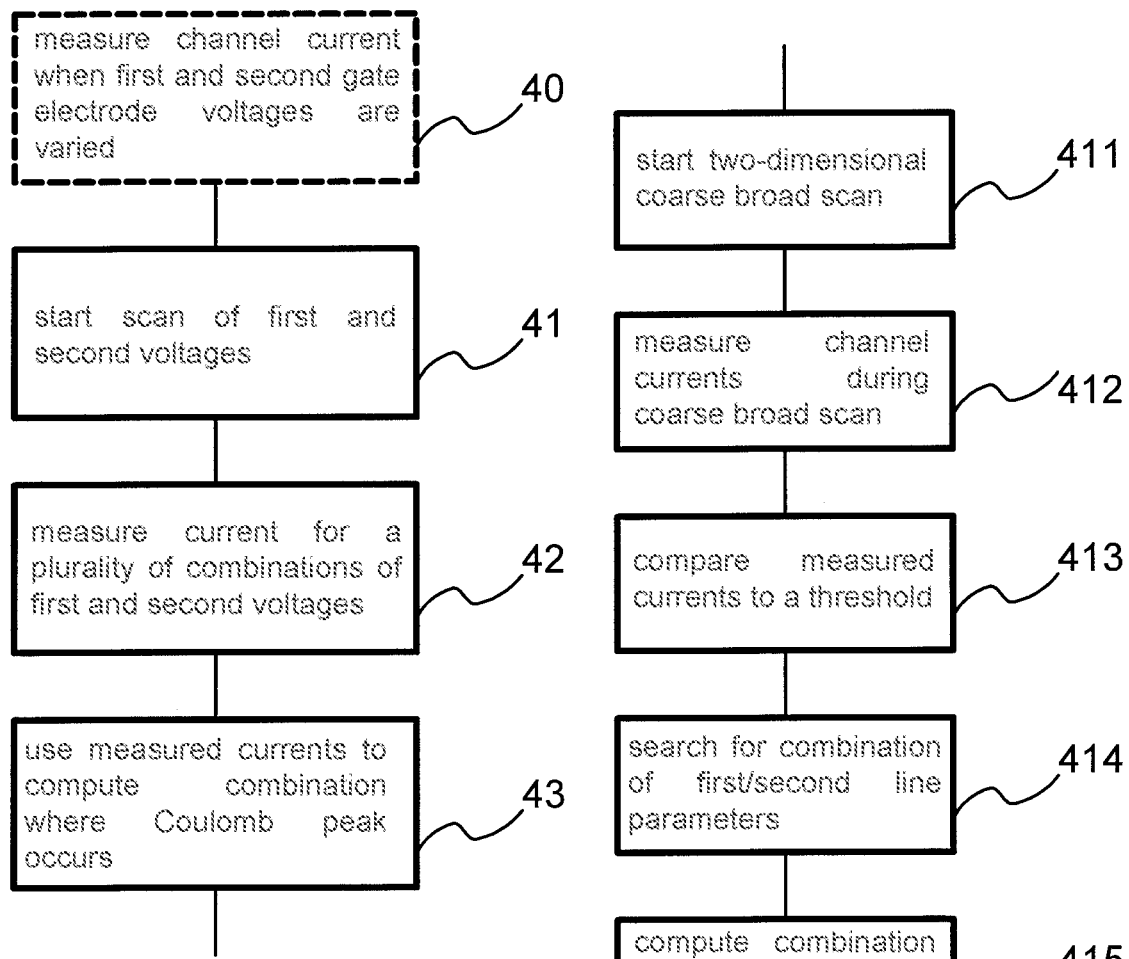

QUANTUM DOT CIRCUIT AND A METHOD OF CHARACTERIZING SUCH A CIRCUIT

CROSS-REFERENCE TO RELATED APPLICATIONS

This application is a U.S. National Stage application under 35 U.S.C. § 371 of International Application PCT/NL2017/050132 (published as WO 2017/150980 A1), filed Mar. 6, 2017, which claims the benefit of priority to Application EP 16158810.8, filed Mar. 4, 2016. Benefit of the filing date of each of these prior applications is hereby claimed. Each of these prior applications is hereby incorporated by reference in its entirety.

FIELD OF THE INVENTION

The invention relates to a quantum dot circuit with quantum dots and a control circuit to control the quantum dots and a method of characterizing a quantum dot circuit.

BACKGROUND

Quantum dots are known per se.

EP2075745 discloses a quantum dot information processing device that includes a double quantum dot system with a row of lobe regions. The device has source and drain electrodes are provided at the ends of the row, between which current can flow, and control electrodes along the side of the row to control coupling between the lobe regions. Bias sources are used to apply bias voltages to the control electrodes.

US20150279981 discloses a quantum semi-conductor with tunnel barriers between successive regions in a quantum well layer. Gate electrodes are provided above the quantum well layer to tune the tunnel rate of electrons through the tunnel barriers.

Similar quantum dot systems are known from E1860600, a publication "Electrostatically defined quantum dots in Si/SiGe heterostructure" by A. Wild et al. in the new journal of physics (EPO ref XP 20200105) discloses electrostatically defined quantum dots, a publication titled "Characterization of a gate-defined double quantum dot in a Si/SiGe nanostructure by T. J Knapp et al (EPO ref XP2030017) and a publication titled "Chapter 6 Quantum Transport in Graphene Quantum Dots", by Hai-Ou Li et al (EPO ref XP 55300335).

As used herein, a quantum dot defines a spatial region wherein a single electron or hole can be confined. In a quantum dot circuit, the spatial region is defined with the aid of an electric field that creates a shallow potential well in which a selectable number of electrons or holes can be confined. Confinement may additionally involve use of a doped semiconductor structure that confines mobile electrons to a border plane between different layers. A quantum dot circuit comprises electrodes and a bias circuit connected to these electrodes to create such potential wells. The bias circuit defines operating voltage levels. Changes between these levels may be used to control transfer of electrons or holes to and from the potential wells and to enable interaction between electrons. Electrons and holes will be referred to generally as charge carriers, but for the sake of explanation, electrons will be used as a representative example of such charge carriers.

The terminology of field effect transistors may be used to describe the electrode structure of such a quantum dot circuit, because it is has elements similar to those of a multi-gate field effect transistor. Contacts like the source and drain contacts of the field effect transistor may be used to supply or drain electrons to and from electron confinement regions. An electron confinement region corresponds to part of the transistor channel. The edges of the channel confine the electrons within the channel.

The electrodes for creating the local potential well correspond to successive gate electrodes of the field effect transistor, lying at successive positions on an edge of the channel. These electrodes need not fully cross the channel as in a conventional field effect transistor. Typically three gate electrodes are needed to control a potential well in the channel: two notionally to create potential barriers on either side of the potential well to separate it from upstream and downstream parts of the channel and one in between these two electrodes notionally to control the depth of the potential well. However, both types of gate electrodes have an effect both on the potential barriers and the well depth.

A plurality of confinement regions may be realized at successive locations along the channel by increasing the number of gate electrodes lying at successive positions on the edge of the channel. In this case, a subset of the gate electrodes is used to create potential barriers between successive potential wells and between the outermost potential wells and the source and drain electrodes. A second set of gate electrodes, with gate electrodes between the electrodes of the first subset serve to control the depths of the potential wells.

As an initial operation for quantum computation, it needs to be controlled whether or not an electron (and optionally how many electrons) is or are "loaded" into the different electron confinement areas. This is done by lowering the potential barriers and/or well depth so as to allow no electron or one electron, or more generally the selected numbers of electrons, to pass to the wells, and subsequently raising the potential barriers so as to confine the electrons and prevent entry of more electrons.

A problem with such quantum dot structures is that the field distribution in the potential wells, and indeed the formation of potential wells to begin with, may be affected by the location and amount of trapped space charge in the surroundings, manufacturing tolerances and other unpredictable effects. The location and amount of trapped space charge cannot be fully controlled and may in fact be different each time when the circuit is cooled to its basic operating temperature (e.g. 1 Kelvin, or 250 mK or lower). This affects the voltages that need to be applied to the gate electrodes to load the selected numbers of electrons into the electron confinement regions.

To select bias voltages of quantum dots electrical characteristics of the quantum clot circuit need to be determined. Generally, the gate voltages can be adapted to compensate for the effect of the actual trapped space charges, each time when the circuit has been brought to its operating temperature. But this requires a gate voltage selection process based on a characterization of the electric properties that can take a considerable amount of time.

The prior art discloses new devices and uses various measurements to show that their devices operate as quantum dots, and to characterize the operation. Most of the prior art documents cited above use a characterization by means of a two dimensional plot, wherein different points correspond to different combinations of gate bias and source-drain voltage and grey or color values at these points represent the source-chain current or differential source-chain resistance. Such a plot may be obtained by scanning the source drain voltage at a number of different bias voltages on one of the gates and measuring the resulting source drain current.

EP2075745 explains that these measurements show so-called "Coulomb diamonds or islands" with, as a function of the bias voltage, periodically wider and smaller drain-source voltage ranges (Coulomb gaps) where relatively lower resistance occurs. Similar plots are shown as a function of the bias voltages of different control electrodes along the row of conductor islands.

Other two dimensional plots used to characterize the device use points that correspond to different combinations of bias voltages at different gates. The grey or color values at these points may represent the differential source-chain resistance or sensed charges. Such a plot can show charging lines and have a honeycomb pattern that delimits different ranges of voltage combinations that correspond to different combinations of electron occupation levels in the quantum dots.

The prior art discloses characterization of the devices by means of such plots. The characterization is used to show the existence of quantum effects and to estimate properties of the device. EP2075745 explains how the slopes of the Coulomb diamonds are related to capacitance ratios of the total capacitance of a conductor island and the coupling capacitance between the conductor island and the control electrode. This ratio can be used to estimate the charging energy of the conductor islands. Selection of gate bias voltages to operate the quantum dot devices is not discussed.

SUMMARY

Among others, it is an object to reduce the amount of time that is needed to select the gate voltages for use in a quantum dot circuit.

An automatic electric characterization is provided, that is, a measurement of effects of gate electrode voltages on potential wells in a channel in a quantum dot circuit according to claim 1. Herein a two dimensional voltage scan of bias voltages for controlling depths of the successive electrical potential wells in the channel, during which charge carrier occupation of potential in the potential wells electron is measured. The scan is preceded by using a pre-scan of channel current as a function of voltage combinations on gate electrodes for creating potential barriers between the quantum dots, in combination with a two dimensional filter operation. In this way suitable combinations may be determined experimentally with a limited amount of measurement time. In a further embodiment, the two dimensional filtering operation has a first image frequency bandwidth for sums of the voltages in the combinations of first bias voltages and a second image frequency bandwidth for differences of the voltages in the combinations of first bias voltages, the second image frequency bandwidth being narrower than the first image frequency bandwidth. This improves the selection of the voltages. A triangularly swept voltage may be used in the scan. This makes it possible to minimize measurement errors while keeping the scan time low.

During the pre-scan, time constant voltages may be applied to voltages not involved in the pre-scan electrodes and the first electrodes, if any, other than said consecutive one of the first electrodes during said scanning over the first two-dimensional range of first bias voltages. In a further embodiment a time constant voltage may be determined in a pre-selection step by detecting a threshold voltage.

A two dimensional voltage scan of bias voltages for controlling depths of the successive electrical potential wells in the channel, during which charge carrier occupation of potential in the potential wells electron is measured, may be used to identify domains of gate voltage combinations corresponding to different charge carrier (e.g. electron) occupation numbers.

Identification of the domains makes it possible to select combined voltage variation paths for realizing preselected combinations of charge carrier (e.g. electron) occupation numbers in successive quantum dots.

Preferably, automatic pattern matching with a pattern of crossing edges along predetermined directions is used to detect crossing edges of such domains, wherein the predetermined directions are determined using a simulation, by computer computing directions of lines of combinations of the voltages of the second gate electrodes which result in equal lowest potential values in potential wells next to the second gate electrodes that extend over the consecutive ones of the second locations adjacent to the potential wells. In an embodiment, the measured derivatives of the charge carrier occupation as a function of the second gate bias voltages may be used as image values as the two-dimensional image.

The simulation may compute of the electric potential field as a function of the voltages given the layout of the gate electrodes and the voltages applied to these electrodes and electric permittivity values (epsilon) of the semi-conductor layer and the region above its surface.

BRIEF DESCRIPTION OF THE DRAWINGS

These and other objects and advantages will become apparent from a description of exemplary embodiments with reference to the following figures.

FIG. 3 shows a flow-chart of calibration
FIG. 4 shows a flow-chart of gate voltage selection
FIG. 4a shows a flow-chart of part of gate voltage selection

DETAILED DESCRIPTION OF EXEMPLARY EMBODIMENTS

Quantum Dot Circuits

Figure 1:
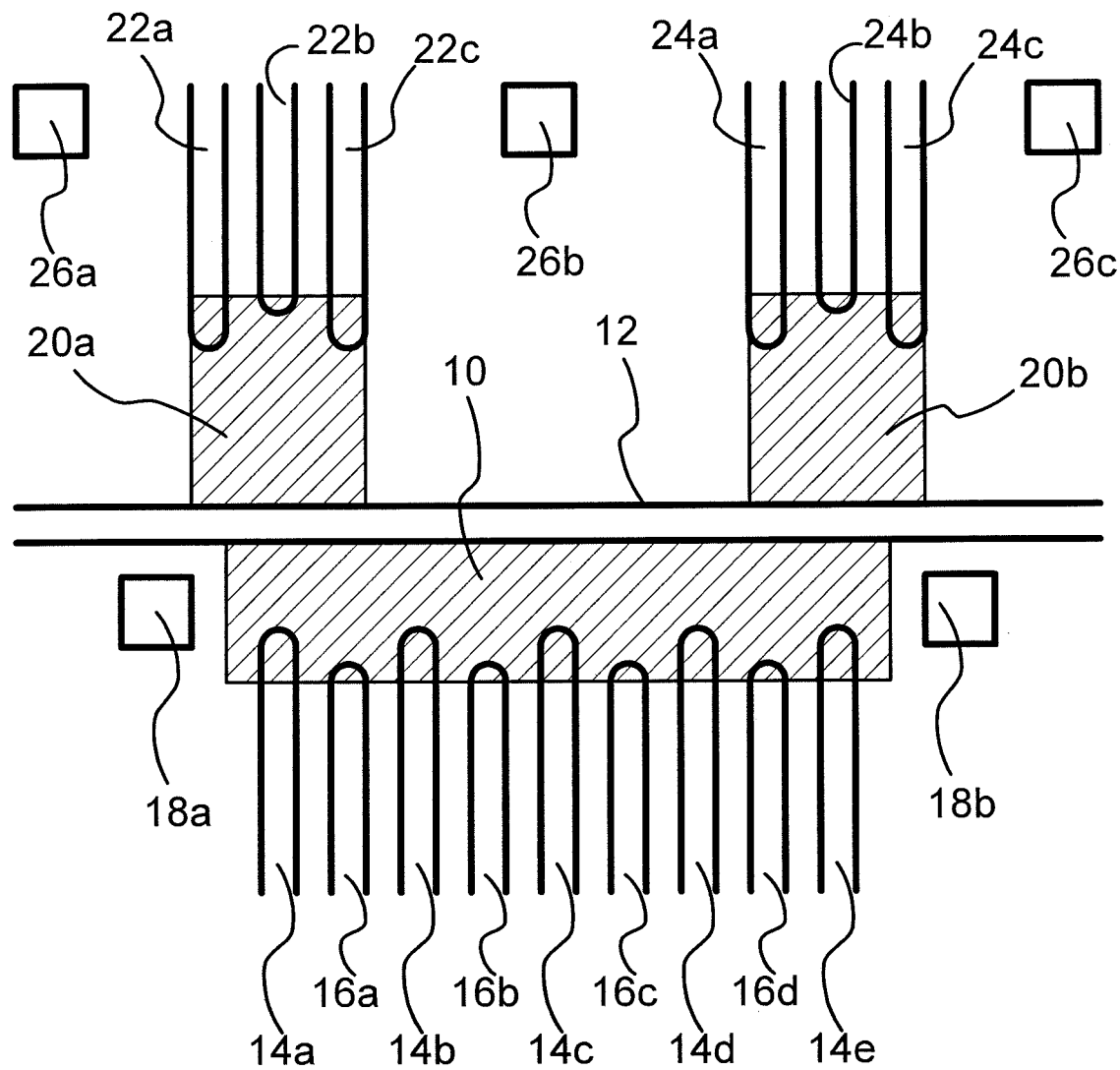
FIG. 1 shows an electrode layout of a quantum dot circuit
FIG. 2 schematically shows a quantum dot control circuit

Quantum dot circuits are known per se. To set out the context of the invention an exemplary quantum dot circuit will be described. A quantum dot circuit makes use of confined electrons or holes and sensing circuits to obtain measurements from such electrons or holes. Electrons and holes will be referred to generally as charge carriers, but for the sake of explanation, electrons will be used as a representative example of such charge carriers. The quantum dot circuit is designed to define a plurality of spatial regions wherein an electron may be confined and additional electrons may be kept out (more generally wherein a selectable electron occupation number can be created and maintained), and to enable manipulation of such regions in order to enable transfer of electrons and interaction between electrons. The quantum dot circuit contains electrodes to create a position dependent electric potential with potential wells that correspond to the spatial regions wherein the electrons may be confined.

In addition, as is known per se, the quantum dot circuit may comprise a layer structure, which confines the electrons in a plane formed e.g. by an interface between two layers. The quantum dot circuit contains electrical contacts to this plane to supply or remove electrons. In addition the layer structure may be used to transmit electromagnetic waves along the interface for use in sensing. A Ga—As structure with a thin layer of Si doping may be used for example, with an interface between differently Al doped layers e.g. a layer with $10^{}11$ donors per cubic centimeter (10 to the power eleven, $10^{}17$ per cubic meter)) and an undoped or less doped layer (higher doping levels than $10^{}11$ may be used, but with much higher doping levels higher voltages may be needed, but similar voltages may be used at least for donor concentrations of e.g. $1\text{-}2\ 10^{}11$).

Moreover, it should be understood that, instead of Ga, As and Al, other materials that provide for a similar plane of electron confinement may be used. Dependent on the material choice, the effects described for electrons may apply to holes instead. As noted electrons will be used as a representative example of charge carriers in general, for the sake of explanation.

When the quantum dot circuit uses such a semiconductor layer structure to create a plane of electron confinement, confinement to spatial regions of limited size only requires electrodes for generating an electric potential field that defines potential wells that in two dimensions in the plane of electron confinement.

Generally, the terminology of multi-gate field effect transistors (FET) may be used to describe such quantum dot circuits. A multi-gate field effect transistor contains a channel region, contacts (source and drain in a FET) in electrical contact with the channel region, and gate electrodes positioned near or across the channel region in order to generate an electric field in the channel region. A direction of the channel and a direction transverse to the channel may be distinguished. The former corresponds to a current flow direction between the contacts.

Accordingly, in the quantum dot circuit an area that contains a series of quantum dots will be called the channel. When confinement to a plane is used in the quantum dot circuit, the channel is confined to the plane of electron confinement. In the quantum dot circuit an electric field is generated that provides for potential walls in parallel to the direction of the channel along the edges of the channel, and successive electric potential wells between the edges. Thus a one dimensional array of potential wells is defined wherein electrons may be confined. Electrodes may be used to generate this field. These electrodes will be called gate electrodes. The gate electrodes are generally directed transverse to the direction of the channel at successive positions along the channel, separated from each other and from the contacts. In an embodiment, different gate electrodes may be used to control both the potential walls and the depth of the potential wells. In other embodiments, the potential walls may created without relying on gate electrodes, for instance by adding dielectric material between the gate electrodes that are used to control the depth of the potential wells.

In contrast to usual FET structures, the gate electrodes in the quantum dot circuit need not extend all the way across the channel. Instead, they may extend only to the edges of the channel, or only partly across the channel, leaving the remainder of the channel to the opposite edge uncovered. However, in some embodiments part or all of the gate electrodes may extend all the way across the channel. Gate electrodes of a first and second type may be distinguished, so that each gate electrode of the second type lies between gate electrodes of the first type. The gate electrodes of the first type are used mainly to control the height of the electric potential walls in the direction transverse to the edges that separate the electric potential wells from each other and from the contacts. The gate electrodes of the second type are used mainly to control the depth of the potential wells, i.e. the minimum potential in the wells. In an embodiment the gate electrodes of the first and second type may alternatingly extend to the edge of the channel or partly across. Geometrically, the gate electrodes of the first type are distinguished from the gate electrodes of the second type in this embodiment by the fact that the former extend further than the latter in the direction transverse to the channel, compared with the latter.

FIG. 1 shows a top view of an exemplary electrode layout of a quantum dot circuit on a surface of such a semiconductor layer structure of the quantum dot circuit. The dashed area 10 indicates the channel region. By way of example area 10 contains a linear array of four quantum dots. The layout comprises a top gate electrode 12 along a first edge of area 10 and a plurality of parallel linear first gate electrodes 14*a-e*, each extending toward a second edge of area 10, opposite the first edge. Linear second gate electrodes 16*a-d* are provided between the first gate electrodes 14*a,e* and in parallel with these electrodes, so that the layout alternately contains first gate electrodes 14*a,e* and second gate electrodes 16*a-d* extending towards the second edge of the area 10. In an embodiment, the gate electrodes are 40-45 nanometer wide, and more generally between 10-80 nanometer and preferably between 40-80 nanometer. Larger gate widths may be used, but they tend to lower the charging energy of the electrons and therefore make control of the electron occupation numbers more difficult. The pitch of the array of first and second gate electrodes 14*a-e*, 16*a-d* (e.g. the distance between the center lines of successive gate electrodes) may be 80 nanometers for example, e.g. about twice the gate width.

The distance from the tips of first gate electrodes 14*a-e* and top gate electrode 12, which defines the channel width may be 150 nanometer for example, or between 75 and 300 nanometer for example. However, this distance need not be the same for all gate electrodes. In an embodiment, the ends of second gate electrodes 16*a-d* lie at a greater distance (e.g. about 25 nanometer more) from the second edge of area 10 than the ends of first gate electrodes 14*a,e*, i.e. the ends of second gate electrodes 16*a-d* lie at a greater distance from the second edge of area 10 than virtual lines between the ends of first gate electrodes 14*a,e*.

Although specific examples of gate electrode dimensions and layout have been given by way of example, it should be appreciated that the invention is not limited to these examples. On the contrary, the effect of different widths may be compensated by adaptation of the voltage levels on the gate electrodes using the processes described herein.

In operation first voltages applied to top gate electrode 12 and first gate electrodes 14*a-e* are used to create an electric field that defines potential walls around the quantum dots in area 10. Roughly speaking, each first gate electrode 14*a-e* creates a potential wall that, seen in projection on the layout, runs from its tip to top gate electrode 12, the quantum clots lying between a successive pairs of potential walls. As will be appreciated, n=4 quantum dots are realized in the illustrated example because n+1=5 first gate electrodes 14*a-e* are provided. But a different number of n+1 first gate electrodes 14*a-e* may be used to create a different number n of quantum dots.

Second voltages on second gate electrodes 16a-d are used to control the depth of the n potential wells surrounded by these potential walls. When the circuit is operated at low voltages, the second voltages can be used to control the number of electrons that will be present in the potential wells. For example, second voltages may set to a value so that a single electron is present. Roughly speaking, each second gate electrode 16a-d should define the depth of the potential well between the potential walls created by the first gate electrodes that are adjacent to that second gate electrode 16a-d. During operation, individual voltages applied to first and/or second gate electrodes 14a-e, 16a-d may be varied to cause electron transfers to different quantum dots and/or to enable interaction between the electrons in adjacent potential wells.

The actual voltage levels that are needed to separate quantum dots and the control the electron occupation numbers may also depend on charge trapped elsewhere in the circuit and manufacturing tolerance. In a complex circuit many local potential minima will be present and when the circuit is cooled, unpredictable numbers of electrons may get trapped in such local minima. The voltage levels needed on the first and second gated electrodes depend, among others, on this unpredictable form of trapping. Therefore they may need to be adjusted each time when the circuit has been cooled to its operating temperature (e.g. to 1 K or to 0.25 K or lower).

Although the first gate electrodes 14a-e are provided to define the potential walls that separate different quantum dots from each other and the outside and the second gate electrodes 16a-d are provided to define the depth of the potential wells between these walls, there is in fact a considerable cross effect, the first voltages on first gate electrodes 14a-e affecting the depth of the potential wells, and the second voltages on second gate electrodes 16a-d affecting the height of the walls.

In addition to the first gate electrodes 14a-e and the second gate electrodes 16a-d, the layout shows contacts 18a, b to the plane of electron confinement at the interface between the semi-conductor layers. Area 10 forms a channel between contacts 18a, b. The first and second edge of area 10 form edges of this channel. Current may flow through the channel between contacts 18a, b. The voltages on to top gate electrode 12, first gate electrodes 14a-e and second gate electrodes 16a-d may be used to control this current. This current may be used to supply electrons to the quantum dots. One of contacts 18a, b, contact 18a, may be permanently connected to a ground electrode to keep it at ground potential.

Sensing Circuit

Apart from the electrodes involved in the array of quantum dots, FIG. 1 also shows electrodes of an exemplary sensing circuit that makes use of electromagnetic wave reflection to detect electron occupation numbers. It should be appreciated that other techniques for sensing the electron occupation may be used. By way of example, the sensing circuit comprises two sensing quantum dots for sensing, located in further dashed areas 20a, b adjacent to the leftmost and rightmost quantum dots of the array in area 10, but on another side of top gate electrode 12. For each quantum dot for sensing a set of three sensing gate electrodes 22a-c, 24a-c is provided. Each set has two electrodes that, like first gate electrodes 14a-e, are used to define potential walls and one electrode that, like second gate electrodes 16a-d, are used to control the depth of the potential well between the potential walls.

Preferably, the pitch of the gate electrodes of a sensing circuit is wider than that in the quantum dot transistor (e.g. 120 nanometer when the gate electrodes of a quantum dot transistor are 45 nanometer apart). In an embodiment, the rightmost gate electrode 22c of the left sensing transistor is aligned with the second first gate electrode 14b from the left in the quantum dot transistor. A similar, but mirror symmetric position is used for the sensing transistor on the right. However these positions are not critical.

Furthermore, the sensing circuit contains sensing contacts 26a-c to the plane of electron confinement at the interface between the semi-conductor layers. In operation, the sets of sensing gate electrodes 22a-c, 24a-c are use to define quantum dots and contacts 26a-c are used to transmit high frequency electromagnetic waves through the plane of electron confinement and to detect reflection of these waves by the quantum dots of the sensing circuit.

Although a sensing circuit for realizing two sensing dots has been shown, using two sets of sensing gate electrodes 22a-c, 24a-c, it should be appreciated that more may be used. In the illustrated embodiment, the two sensing dots substantially sense a combined effect electron occupation numbers of groups of two of quantum dots. In other embodiments sensing dots for individual quantum dots or different groups of quantum dots may be used.

Another example of a method of sensing occupation numbers is capacitance measurement. Herein capacitance to ground of one or more of the gate electrodes that define the potential wells is measured to probe the electron occupation of one or more potential wells.

Control Circuit

Figure 2:
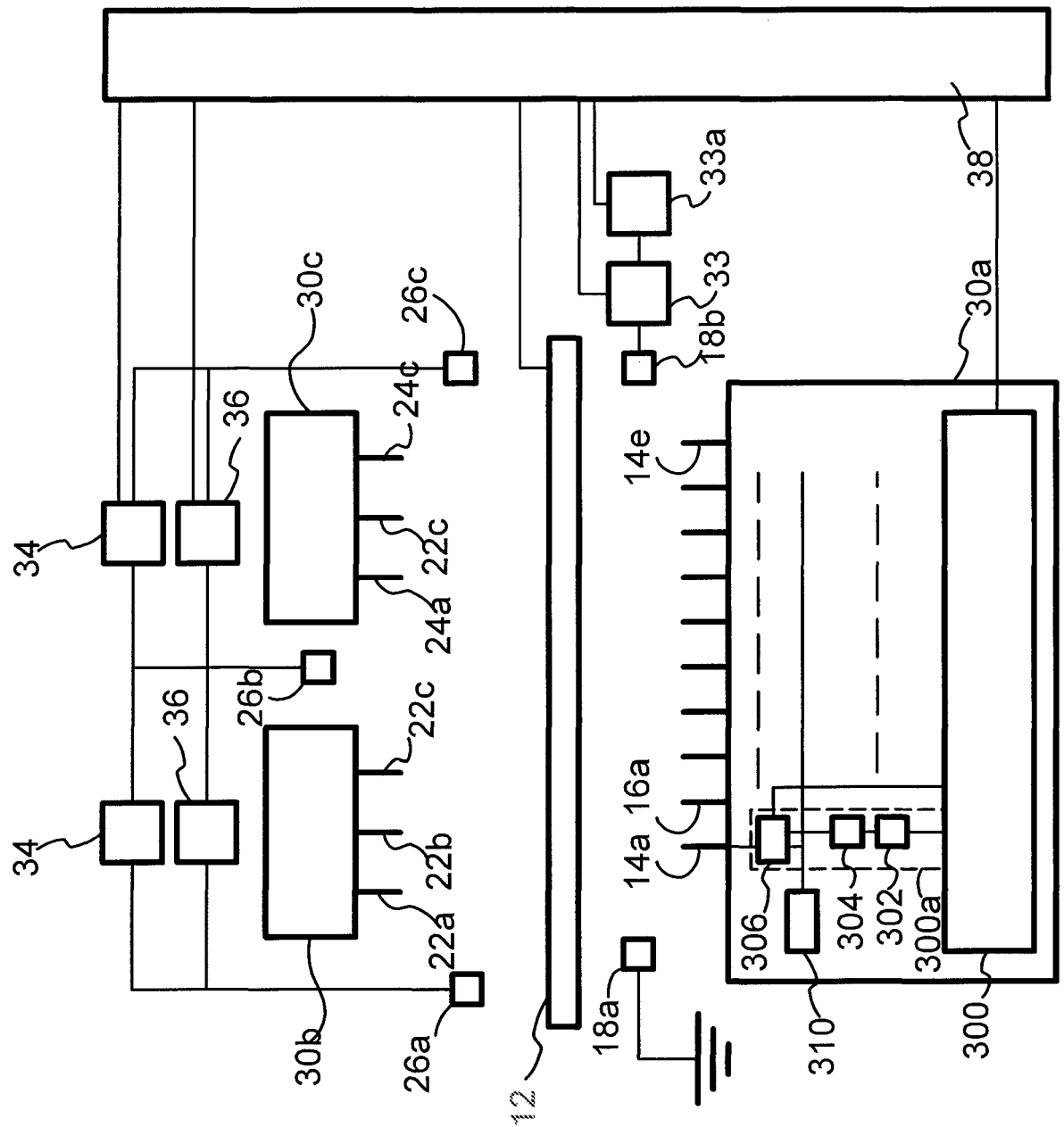

FIG. 2 schematically shows a quantum dot control circuit, comprising a bias generation circuit 30a-c, a current sensor 33, high frequency signal generators 34, high frequency signal detectors 36 and an overall control circuit 38. Current sensor 33 is coupled to contact 18b, e.g. between contact 18b and a voltage source 33a. The contact 18a at the other end of the channel may be connected to ground. Current sensor 33 is configured to sense current flowing to the plane of electron confinement. High frequency signal generators 34 may be configured to generate waves at a frequency if 100 MHz for example or in a range of 10-1000 MHz. High frequency signal generators 34 have outputs coupled to contacts 26a-c of the sensing circuit and high frequency signal detectors 36 have inputs coupled to these contacts 26a-c.

In operation, bias generation circuit 30a-c serves to supply programmable voltages or programmable sequences of voltages values independently to individual electrodes (14a-e, 16a-d, 22a-c, 24a-c). For the sake of illustration, bias generation circuit 30a-c is drawn in three parts, connected to different groups of electrodes but in practice the three parts may be part of a single bias generation circuit. Bias generation circuit 30a-c may additionally have output coupled to other electrodes, such as top gate electrode 12, and/or to contacts 18a,b, 26a-c. Bias generation circuit 30a-c may comprise a calibration circuit 300, and a plurality of bias voltage output stages 300a for individual electrodes (only one stage shown). The bias voltage output stage 300a for each individual electrode (14a-e, 16a-d, 22a-c, 24a-c) may comprise a digital bias voltage register 302 and a digital to analog converter 304. Calibration circuit 300 has outputs coupled digital bias voltage registers 302 for the respective electrodes. In turn the output of the bias voltage registers 302 for an electrode is coupled to an input of digital to analog converter 304 for the electrode, which has an output coupled directly or indirectly to the gate electrodes (14a-e, 16a-d, 22a-c, 24a-c) of the sensing circuit.

In operation, bias generation circuit 30a-c may be used to apply voltage sweeps to selectable electrodes. In principle this may be realized loading successive values into register 302 during the sweep, corresponding to voltages during the sweep. The illustrated embodiment shows how this may be realized using an additional analog sweep generator. In the illustrated embodiment bias generation circuit 30a-c comprises an analog sweep voltage generator 310 and the bias voltage output stage 300a for each individual electrode comprises a multiplexer 306. Multiplexer 306 has voltage inputs coupled to the analog sweep voltage generator 310 and the digital to analog converter 304 of the bias voltage output stage 300a, and a control input coupled to an output of calibration circuit 300. In operation, calibration circuit 300 may control the multiplexers to determine to which, if any, electrode the sweep voltage is applied. However, alternatively the sweep may be realized without a sweep generator and multiplexers, by supplying successive sweep values to a bias voltage register 302.

Overall control circuit 38 has outputs coupled to bias generation circuit 30a-c and high frequency signal generators 34 and inputs coupled to contacts 18a,b and high frequency signal detectors 36. Overall control circuit 38 may comprise a programmable computer, programmed to perform a calibration process and optionally to control normal operation using calibration settings obtained from the calibration process. Where, in the following, steps performed by overall control circuit 38 are described, it should be understood that these may be performed by execution of a program by this computer. Overall control circuit 38 will be said to be configured to perform these steps in the sense that it contains a program that, when executed by the computer, will cause these steps to be performed. The program may be provided in a computer program product like a computer readable semi-conductor memory (e.g. a non-volatile memory), a magnetic or optical disk etc. Alternatively, overall control circuit 38 may be configured to do so by means of a hardwired circuit, such as a programmed gate array.

Calibration

Overall control circuit 38 is configured to control a calibration process for selecting the bias voltages on first gate electrodes 14a-e and/or second gate electrodes 16a-d produced by bias generation circuit 30 so as to ensure effects such as separation of the quantum dots, similarity of different quantum dots and to control the electron occupation number of each quantum dot (e.g. so that each quantum dot contains one electron).

Unfortunately, the bias voltages on individual gate electrodes need to be selected in combination with each other. As noted, there is a considerable cross effect whereby voltage changes on individual electrodes affect the effect of voltages on other electrodes.

FIG. 3 shows a flow-chart of operation of overall control circuit 38 during calibration in an embodiment wherein both bias voltages on first gate electrodes 14a-e and second gate electrodes 16a-d are selected. In a first step 39a, overall control circuit 38 selects a combination of bias voltages for the first gate electrodes 14a-e. In a second step 39b overall control circuit 38 selects a combination of bias voltages for the second gate electrodes 16a-d. It should be noted that it may suffice to perform one of these steps: for example if dielectric separations are used instead of first gate electrodes 14a-e, no calibration of the bias voltages of these electrodes may be needed. Similarly, a single step may suffice if predetermined calibration values are available for the other step. When a suitable combination of bias voltages for the first gate electrodes 14a-e is known in advance, or sufficient data is available to compute suitable voltages, first step 39a need not comprise measurements.

Bias Voltages of the First Gate Electrodes

FIG. 4 shows a more detailed flow-chart of steps involved in an exemplary embodiment of first step 39a of FIG. 3 wherein a combination of bias voltages for the first gate electrodes 14a-e is selected based on measurements. Herein, a combination of a first and second voltage to be applied to at least a first and second one of the first gate electrodes 14a-d, which will be referred to as first gate electrodes under test. By way of example, a first voltage applied to the first gate electrode 14a at the outside of the array of quantum dots and a second voltage to be applied to the next "internal" first gate electrode 14b is selected.

The calibration may be directed at ensuring similarity of different quantum dots, i.e. invariance to exchanging quantum dots. The effect of tunneling shown by Coulomb peaks is used to detect the similarity of quantum dots in terms of electrochemical potential levels (quantum levels).

In a first step 41, optionally after an optional preselection step 40 that will be discussed later, overall control circuit 38 starts a scan of the first and second voltage. The scan proceeds through a plurality of different settings of the first and second voltage. Preferably the quantum dot control circuit comprises an analog voltage sweep generator and a switch (not shown) for coupling the analog swept voltage generator to selectable ones of the first gate electrodes 14a-e. In this embodiment, control circuit 38, in first step 41, causes the switch to couple the analog voltage sweep generator to part of the first gate electrodes under test, trigger a plurality of voltage sweeps while respective different voltage settings are applied to the other first gate electrode under test and to measure resulting current values during the sweeps. In another embodiment, the voltage settings of both first gate electrodes under test may be swept together, with respective different offsets between the different sweeps. In another embodiment, the voltage settings of the first gate electrode under test may be swept together, while keeping their sum constant at a sum value, with respective different sum values in different sweeps. In an embodiment repeated sweeps may be used while the same offset, sum value or voltage setting of other first gate electrode under test is applied and the measured currents for the same combination of the first and second voltage are averaged.

In another embodiment, control circuit 38, in first step 41, may realize the plurality of combinations of the first and second voltage by causing a scan in two voltage dimensions, by setting one of the first and second voltage to successive values and varying the other of the first and second voltage each time while the other is at a different one of the successive values in a second step 42, and repeating the measurement of first step 41 until currents for all combinations have been measured. Accordingly, control circuit 38 may set the content of the plurality digital bias voltage registers 302 to cause digital to analog converters 304 to apply successive combinations of voltages to first gate electrodes 14a-e. For each combination, control circuit 38 reads the resulting current from current sensor 33.

In a second step 42 overall control circuit 38 measures the current through the channel from contact 18b for a plurality of combinations of the first and second voltage during the scan, while the voltages on the other first gate electrodes 14c-d, the second gate electrodes 16a-d, the top gate electrode are kept constant and a small bias voltage (e.g. 0.5 mV) is applied between contacts 18a,b. In an embodiment, the voltages on the other first gate electrodes 14c-d, the second gate electrodes 16a-d may be pre-selected at their threshold values as gates of the field effect transistor. In an embodiment repeated current measurements are performed for each combinations of the first and second voltage and the results are averaged.

In an embodiment, the voltages on the other first gate electrodes 14c-d and the second gate electrodes 16a-d, which are kept constant during the measurements, may be determined in a preselection step 40 wherein the channel current is measured when the voltage on each one of first gate electrodes 14c-d, the second gate electrodes 16a is varied. This results in a FET-like drain-source current dependence on the variable gate voltage, increasing from zero current to a saturation current when the voltage is raised above as threshold. The pre-selected voltage may be set e.g. at the voltage where the current reaches a predetermined fraction (e.g. 50%) of the saturation current. Optionally, the voltages may be set initially by applying the same voltage to all first gate electrodes 14a-d, the second gate electrodes 16a-d, measuring the channel current when this voltage is varied and selecting an initial voltage at which a further predetermined fraction of the saturation current is reached.

Figure 5:
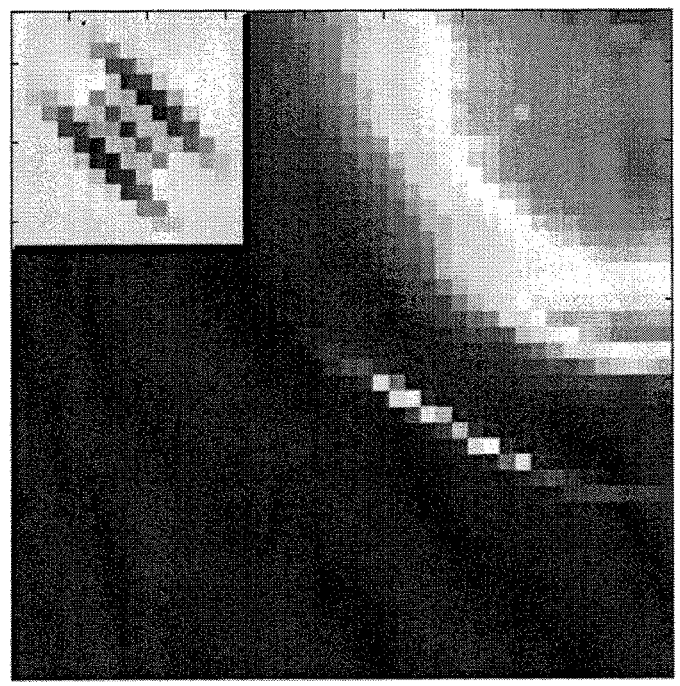
FIG. 5 shows a plot in a plane of current for different gate voltage combinations

FIG. 5 shows a plot in a plane of combinations of the first and second voltage (measured relative to an arbitrary reference level, such as the potential of contact 18a). The grey level indicates the size of the channel current. The plot shows that significant current (light) flows when both voltages are relatively high, e.g. zero, and no significant current flows (dark) when either or both voltages are sufficiently negative. This corresponds to conventional FET current cut-off of a normally-on (negative threshold) FET when the gate voltage is lowered below the FET threshold. A threshold contour may be defined above and to the right of which the current lies above a predetermined threshold, which may be a fraction (e.g. 0.5) of the saturation current.

In the quantum dot layout, both of the first gate electrodes under test influence the electric field in the channel. As a result the threshold for each voltage becomes less negative when the other voltage increases, which results in a threshold contour 50 from the threshold for the first voltage when the second voltage is zero and the threshold for the second voltage when the first voltage is zero. However, there are also one or more islands 52 of first and second voltage combinations beyond this threshold contour, called Coulomb peaks. These peaks correspond to circumstances under which quantum tunneling through the electrical potential barriers is possible, i.e. when an electrochemical energy level between the potential barriers substantially matches electrochemical energy levels outside the barriers.

In a third step 43 overall control circuit 38 uses the measured currents to compute a combination of the first and second voltage where the Coulomb peak 52 occurs. In an embodiment, overall control circuit 38 determines the location of the Coulomb peak by applying a two-dimensional filter operation, which passes a difference between the first and second voltage as a low pass filter (including passing zero frequency) and a sum of the first and second voltage as a high frequency band pass filter, i.e. a filter with a pass band that contains only frequencies higher than those in the pass band of the low pass filter used for the difference. The selection of the filter is based on the knowledge that Coulomb peaks are relatively wide as a function of the difference and relatively sharp as a function of the sum, enabling the detection of its position using a filter that suppresses noise by means of a low pass filter that has a narrower frequency bandwidth as a function of the difference than passed frequencies of the sum. In an embodiment a broad high frequency band pass filter may be used, i.e. a filter with a frequency bandwidth that is broader than the frequency bandwidth of the low pass filter used for the difference. Instead of a high frequency band pass filter a high pass filter may be used i.e. a filter with a pass band that contains only frequencies higher than those in the pass band of the low pass filter used for the difference.

In embodiment, the filter operation in the sum direction or in the difference direction may already be performed during the sweep. For example the filter operation in the sum direction may be performed during the sweep when the voltages of both first gate electrodes under test are swept together, with respective different offsets. The filter operation in the difference direction may be performed during the sweep when the voltages of the first gate electrodes under test are be swept together, while keeping their sum constant at a respective sum value. As a low pass filter operation is used in the difference direction, this may reduce the amount of data.

An example of such a filter is a filter with a response function that is a product of first Gaussian response function $G((V1-V2)/W1)$ of the difference V1–V2 of the first voltage V1 and the second voltage V2 and a second Gaussian response function $G((V1+V2)/W2)*\cos(\text{omega}*(V1+V2))$ of the sum V1+V2, multiplied by a cosine $\cos(\text{omega}*(V1+V2))$ of V1+V2 to provide for a band pass filter at a frequency omega. Preferably, the first Gaussian function has a larger width W1 than the width W2 of the second Gaussian response function (the frequency bandwidths being inversely proportional to these width W1, W2). This results in a version of a Gabor filter, which is known per se from 2D image processing. However, instead other filters with a different filter response function may be used that has a frequency pass band for the sum V1+V2 that contains only frequencies higher than those in the pass band of the filter used for the difference V1–V2, and preferably has a lower frequency band width for the latter (V1–V2) than for the former (V1+V2). Filtering is effectively applied to an "image" containing the current values as image values as a function the applied combination of voltages. The image location of a maximum in the filter output may be used as an estimate of a location of the Coulomb peak.

In an embodiment, a speed up of the process may be realized based on the knowledge that the threshold contour may be approximated as a combination of two substantially straight line parts, and that the Coulomb peak lies near the intersection of these straight line parts. In this embodiment, first and second step 41, 42 may be preceded by steps as shown in FIG. 4a including a first step 411 of starting a two-dimensional coarse broad scan, a second step 412 of channel current measurement during the coarse broad scan and steps to select a fine narrow scan range, for use as the two-dimensional scan range in first step 41. Herein course-fine and broad-narrow mean that coarse broad scan involves a broader range of voltage value combinations than the fine narrow scan, with a lower density of voltage value combinations at which the current is measured than in the fine narrow scan.

By way of example, the steps to select the fine narrow scan range comprise a third step 413 wherein overall control circuit 38 compares the currents measured in second step 412 to determine, for each of a set of combinations of first and second voltages applied during the coarse broad scan, whether the current measured for that combination of voltages is above or below a threshold. The threshold may be a predetermined fraction of a saturation current of the transistor. Thus, the subset of combinations of voltages for which the current lies above the threshold lie in the area of FIG. 5 that is delimited by a threshold contour.

In a fourth step 414 overall control circuit 38 searches for a combination of parameters of a first and second straight line in the two dimensional plane of the combinations of first and second voltages that best approximates the threshold contour. The best approximation may be defined in terms of a cost function. A count of combinations of the first and second voltages that lie on the wrong side of the first and second straight lines may be used as such a cost function (a sum of a first number of combinations of voltages for which the current lies above the threshold and the combination lies outside the approximate d contour (to the left and/or below the straight lines) and a second number of combinations of voltages for which the current lies below the threshold and the combination lies within the approximate d contour ((to the right and above the straight lines))).

In a fifth step 415 overall control circuit 38 computes the combination of first and second voltages at which the selected first and second lines intersect. Overall control circuit 38 selects a scan range of the fine narrow scan as a range that comprises the computed combination of values of the first and second voltage, preferably at a distance from the boundaries of the range (e.g. in the center of the range).

Instead of the described fourth 414 step, overall control circuit 38 may use a different method of determining the straight lines, e.g. by selecting combinations of first and second voltages that lie on or immediately adjacent to the threshold contour and applying least square line fitting processes to different subsets of these selected combinations, where V1>V2 ands V1<V2 in the different subsets respectively).

The subsequent fine narrow scan steps 41, 42 then comprises scanning and measuring current during the fine narrow scan for use in third step 43. In this embodiment, filtering involved in determining the Coulomb peak needs to be applied only to the fine narrow scan result.

The result of the process of FIG. 4 is a selection of voltages for a pair of consecutive first gate electrodes 14a-d. The process may be repeated for other pairs of consecutive first gate electrodes (14b,c, 14c,d, 14d,e). To combine the results for different pairs, averages of Coulomb peak voltages obtained for the same first gate electrode 14a-d from different pairs may be used (e.g. the average of the voltage of first gate electrode 14b obtained for the pairs 16a,b and 16b, c).

In other embodiments, other combinations may be used. As can be seen from the figures, the Coulomb peak may allow for selection of the combination of a ranges of voltage combinations that are all on the same Coulomb peak (e.g. a range of combinations wherein the sum of the voltages is the same but the difference may have different values within a measured range of the peak). This may be used to select combinations of voltages for two pairs of electrodes, wherein the pairs both contain a same electrode, such that the combinations have the same voltage for said same electrodes and the voltages are in the ranges of voltage combinations detected from the Coulomb peaks. In other embodiments, the determination of combinations for two pairs of electrodes may comprise a further scan, such as a scan in search of a combination of the voltage on the electrodes that are not shared by the pairs, while keeping the voltage on the shared electrode constant, e.g. at a value selected based on preceding scans.

Bias Voltages of the Gate Electrodes of the Sensing Circuit

Bias voltages for the gate electrodes of the sensing circuit may be selected by processes similar to those described for the first gate electrodes. However, in order to increase sensing sensitivity the selected voltages for the gate electrodes of the sensing circuit are preferably subsequently offset from the Coulomb peaks, to a location on the flank of the island.

Bias Voltages of the Second Gate Electrodes

Figure 6:
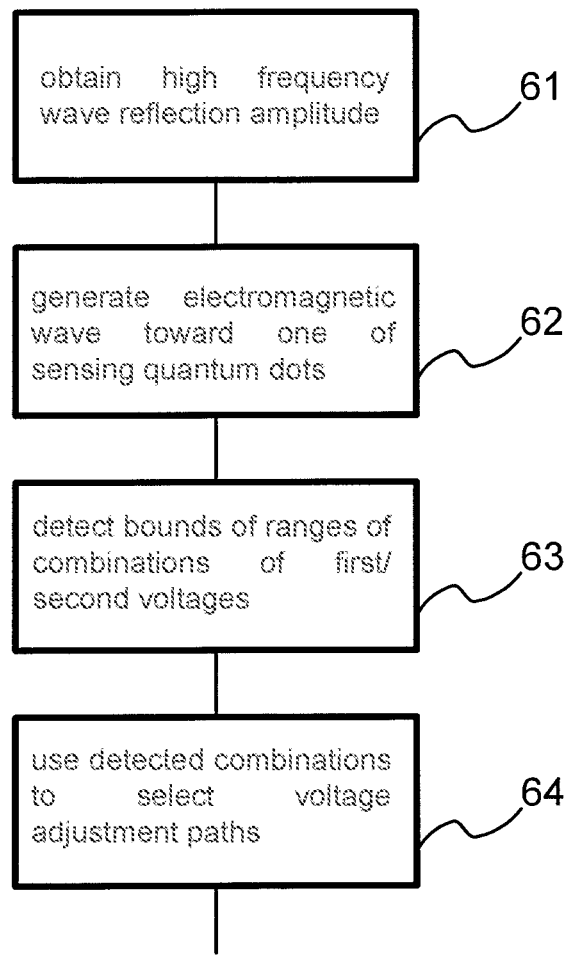
FIG. 6 shows flow-chart of plunger voltages selection

FIG. 6 shows a more detailed flow-chart of steps involved in second step 39b of FIG. 3. Herein overall control circuit 38 determines a combination of a first and second voltage, where the first voltage is applied to a first one of the second gate electrodes 16a that extends to a first quantum dot and the second voltage to be applied to a second one of the second gate electrodes 16b that extends to a second quantum dot directly adjacent to that the first quantum dot. In the context of FIG. 6 these will be referred to as the second gate electrodes under test.

In a first step 61 overall control circuit 38 obtains the high frequency wave reflection amplitude of one of the sensing quantum dots that lies closest to the first quantum dot, for a plurality of combinations of the first and second voltage on the gate electrodes under test, while the voltages on the first gate electrodes 14a-d are kept constant at the combination of voltages found in the first step of the flow chart of FIG. 3. Wave reflection at 100 MHz may be used for example of in a range of 10-500 MHz. The combinations of voltages may be realized in a similar way as described for FIG. 4. In a second step 62, performed for different combinations of voltages, overall control circuit 38 causes the high frequency signal generator 34 connected to one of the sensing contacts 26a-c to transmit a high frequency signal that generates an electromagnetic wave towards said one of the sensing quantum dot in the plane of electron confinement. Control circuit 38 reads a detected reflection amplitude of that wave from a high frequency signal detector 36 coupled to one of the sensing contacts 26a-c that receives reflections from said one of the sensing quantum dots.

Figure 7:
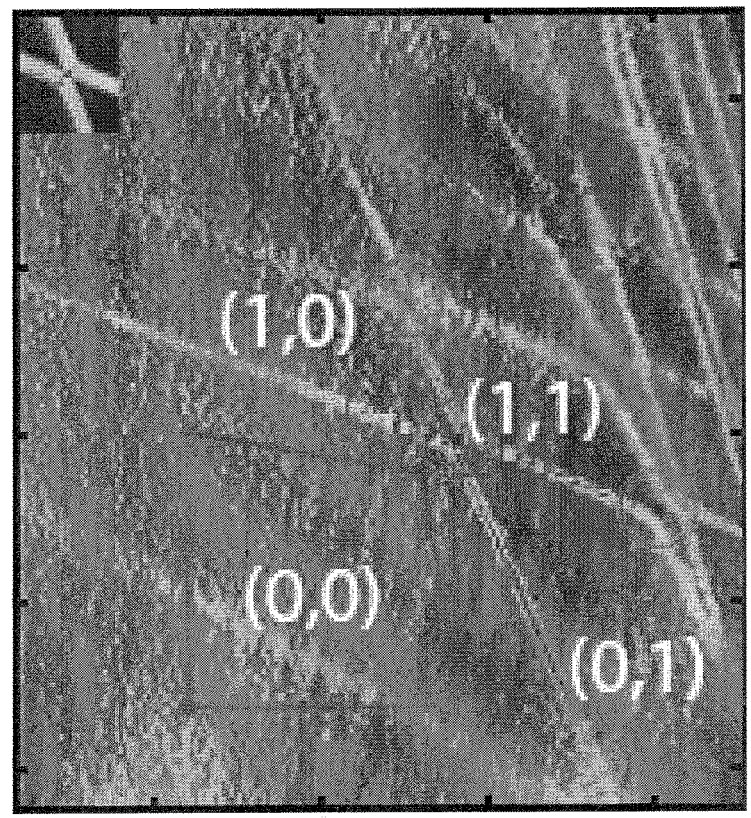
FIG. 7 shows a plot of the derivative of reflection amplitude

FIG. 7 schematically shows a plot of the derivative of the measured reflection amplitude with respect to one of the voltages (or time that voltage is scanned at constant speed) in a plane with points that correspond to combinations of the first and second voltage. The grey level indicates the value of the derivative. Lines can be distinguished in this plot that are due to stepwise changes of the reflectivity, corresponding to stepwise increases of the occupation numbers of the first and second quantum dots.

It may be noted that, if the depth of the potential wells of the first and second quantum dot would depend only on the adjacent second gate electrodes 16a,b the lines in FIG. 5 would run horizontally and vertically. However, as can be seen, the lines do not run horizontally and vertically, which corresponds to the fact that the voltages on both second gate electrodes 16a,b affect both depths.

This cross-effect may be confirmed by computation of the electric potential field as a function of the voltages given the layout of the top gate electrode and the first and second gate electrodes and the voltages applied to these electrodes and electric permittivity values (epsilon) of the semi-conductor layer and the region above its surface. This is a model based computation, i.e. a simulation of operation of the quantum dot circuit rather than a measurement. Such a computation may be used to predict the angles of the lines. The angles may be predicted by computing a first and second contour (line of combinations of the voltages of the second gate electrodes 16a,b) which result in equal lowest potential values in a potential well closest to the end of the first and second one of the second gate electrodes 16a,b respectively. The computed angles may be used as a prediction for the angles of the lines in FIG. 7. In a third step 63, overall control circuit 38 detects bounds of ranges of combinations of the first and second voltage that corresponds to the presence of specific electron occupation number in each of the quantum dots. The measured derivatives as a function of the first and second voltage may be treated as a two-dimensional image.

In an embodiment, detection of the bounds may be implemented by matching a pattern containing intersecting lines at the predicted angles with the image. Overall control circuit 38 may do so by computing correlations between a two-dimensional pattern containing crossing lines at the predicted angles and the two-dimensional image as a function of a two-dimensional position shift of the pattern relative to the image. In this case overall control circuit 38 may use local maxima of the correlation as a function of the position shift to select "combinations points", of combinations of voltages where line crossings are detected. In another embodiment, overall control circuit 38 may apply line or edge detection filters for lines or edges at the predicted angles to the image of the derivatives, or an image of the reflection measurements themselves, fit lines to the output of the filters for the different predicted angles and compute the combinations points from intersections of these lines.

Each detected combination point may be used to define four adjacent ranges (domains) of combination values, separated by lines through the combination point at the predicted angles. If only one combination point is detected, these ranges may be assumed to correspond to four domains with n and m electrons in the quantum dots, where n=0 or 1 and m=0 or 1. For example, the domain with n=0, m=0 lies in the direction from a combination point wherein both voltages decrease (the "lower left domain"). The domain with n=1, m=1 lies in the direction from the combination point wherein both voltages increase (the "upper right domain"). The other domains correspond to n=1, m=0 and n=0, m=1 according to whether the closest second gate electrode has a higher or lower voltage than at the combination point. If overall control circuit 38 detects more than one combination point, overall control circuit 38 may select the combination point where the sum of the voltages is lowest as the m=0, n=0 combination point.

A plurality of combination points may be used to determine all bounds of a domain entirely. In an embodiment, the bounds of the domain may be determined as straight lines in the plane of combinations the voltages of the second gate electrodes 16a,b between the detected combination points. In an embodiment, the bounds of the domains may be determined by fitting the bounds to detected edges in regions between pairs of the combination points.

In a further embodiment, further combination points and/or domains of combination values involving higher electron occupation numbers may be determined in a similar way, e.g. one or more of domains with n=2 and m=0, with n=2 and m=1, with m=2 and n=0, with m=2 and n=1 and with m=2 and n=2. A lattice of combination point may determined, using detected combination points and optionally inferred combination points obtained by interpolating or extrapolating the from detected combination points in the lattice. The lattice may be used to define domains with corners at the lattice points.

If the structure provides for more than two potential wells along the channel, overall control circuit 38 may repeat first to third step 61-63 for different pairs of successive potential wells along the channel. In this way, combination points and/or ranges of combination values corresponding to different occupation numbers may be determined for each pair of successive potential wells.

In a fourth step 64, overall control circuit 38 uses the detected combination points and/or ranges to select voltage adjustment paths for use to create the selected electron occupation numbers in the successive potential wells (e.g. one or zero electrons). Overall control circuit 38, may store the selected voltage adjustment paths for repeated use during operational control of the quantum dot circuit.

The purpose of the voltage adjustment paths is to control the electron occupation of the different potential wells, e.g. so that each potential well contains one and no more confined electron (which will be referred to as occupation 1111, wherein the digits "1" indicate the electron occupation number in successive potential wells), or so that occupations 0111, 1011, 1101, 1110 etc. are realized. In other embodiments, the voltage adjustments may be made so that the potential wells have occupation numbers selected from a range with higher occupation numbers (e.g. from {0, 1, 2} or {0, 1, 2, 3}. Thus for example, combinations of occupation numbers 2222 or 3333 or combinations with different occupations in different wells may be selected. Such occupations may be realized by first setting the gate voltages at a level that allows electrons to leave or reach a furthest potential well from a source or drain of electrons, subsequently modifying the gate voltages to confine the selected number of electrons (e.g. one or zero) in the potential well and to repeat this for potential wells that are successively closer to the source or drain of electrons, while keeping the previously loaded electrons in confinement.

As can be seen from FIG. 7, the occupation numbers in this process depend on voltages on combinations of second gate electrodes 16a-d. Once n=0 or 1 electrons have been loaded in a first potential well, loading m=0 or 1 electrons in a second, adjacent potential well involves varying the voltage on the second gate electrode 16a-d next to this second potential well. But, as can be seen from FIG. 7, changes of the voltage on this second gate electrode 16a-d may also affect the occupation number in the first potential well (when the gate voltage changes causes the boundary between domains with different occupation numbers in the first potential to be crossed), dependent on the concurrent voltage applied to the second electrode 16a-d next to the first potential well.

The combination points and/or ranges determined in third step 63 show the range within which the voltage applied to the second electrode 16a-d next to the first potential well must be kept in order to preserve the same electron occupation in the first potential well. Preferably, the voltage is kept substantially in the middle of this range. This range varies as a function of the voltage applied to the second electrode 16a-d next to the second potential well when this voltage is varied to select the electron occupation of the second potential well. Thus, it is possible to determine, for each selectable occupation number "n" in the first potential well, a voltage V1 to be applied to the second electrode 16a-d next to the first potential well as a function $V1=F_n(V2)$ of the voltage V2 applied to the second electrode 16a-d next to the second potential well. This function may be set to the middle value of the relevant range at the voltage V2, or any other value in that range with at least a predetermined minimum voltage distance to the bounds with adjacent ranges with a different value of the occupation number "n". Similar functions of joint variation of voltages on successive second gates electrodes may be distinguished for successive pair of electrodes. The functions may be used during operation to set the selected occupation numbers "n" of successive potential wells.

In fourth step 64, overall control circuit 38 uses the detected combination points and/or ranges to define the functions Fn(V2) to determine the voltages V1 of a neighboring second gate electrode 16a-d as a function of the voltage on a second gate electrode 16a-d and/or to define two-dimensional time dependent voltage path of successive combinations of voltages at successive pairs of second gate electrodes 16a-d, for use to create the selected electron occupation numbers of the successive potential wells.

As noted, the process of FIG. 6 may be repeated for successive pairs of consecutive second gate electrodes (16a, b, 16b,c, 16c,d). Similarly, the selection of voltages for the first gate electrodes 14a-e may be repeated for different pairs of first gate electrodes 14a-e. To combine the results for the voltage on a first gate electrode 14a-e from different pairs of first gate electrodes 14a-e, averages of Coulomb peak voltages obtained for the same second gate electrode 16a-d from different pairs may be used (e.g. the average of the voltage of second gate electrode 16b obtained for the pairs 16a,b and 16b,c).

Although an example has been described for a quantum dot circuit with a specific layout, it should be understood that a similar calibration process may be applied to other layouts. As noted, the quantum dot circuit generally comprises a FET like structure, i.e. a structure that comprises a channel, alternating first and second gate electrodes that extend to locations along an edge of the channel at least as seen in projection perpendicular to the plane of electron confinement, or extending across the channel. The first gate electrodes preferably extend further than the second gate electrodes in a direction transverse to the direction of the channel, so that the first electrodes have a greater effect on the channel current than the second gate electrodes. But in other embodiments the second gate electrodes may extend further than the first gate electrodes or both may extend equally far, or first gate electrodes may be replaced by dielectric separations. Although two contacts 18a,b have been shown for the transistor by way of example, more may be used, e.g. between the gate electrodes, or a single contact may be used.

The FET like structure may comprise a semi-conductor structure that defines a plane of electron confinement, the gate electrodes lying in an electrode plane that is parallel to said plane of plane of electron confinement, at a distance from which the gate electrodes control the electric potential field in the plane of electron confinement. In an embodiment, gate electrodes above and below this plane of electron confinement may be used. Pairs of transistors may be used with adjacent parallel channels, or gates on either side of a channel or within the channel may be used to realize successive rows of potential wells, the rows lying at successive positions along the channel.

For such devices in general, calibration comprises measuring channel currents and using the measured currents to select bias voltages for the pairs of first gate electrodes, including a channel current measurement as a function of combination of voltages on at least two consecutive first gate electrodes. The measured currents may be used to select a combination of bias voltages of the consecutive first gate electrodes that form a first two-dimensional image that has combinations of bias voltages as image points and measured channel currents (preferably averaged channel currents) as image values. Preferably one of the voltages of the combination is applied in successive voltage sweeps, the other voltage (or other voltages) being changed at a slower rate than the sweeps.

Next, measurements of an indication of (changes of) electron occupation of one or more combinations of potential wells along the channel are performed as a function of combination of voltages on at least two consecutive second gate electrodes and are used to select bias voltages for the second gate electrodes, form a second two-dimensional image that has combinations of bias voltages as image points and measured indications of electron occupation as image values.

Preferably, the combination of bias voltages of the consecutive first gate electrodes is selected by applying a two-dimensional filter to the first two dimensional image, using a two-dimensional filter that is selective for two-dimensionally isolated islands of higher current. Preferably, the channel current measurement as a function of combination of voltages on at least two consecutive first gate electrodes comprises a first and second two-dimensional scan, wherein the first scan is broader and coarser than the second scan, and a two-dimensional range of the second scan is selected based on detection of a location in the first scan.

In an embodiment, said indication of electron occupation is an amplitude of a reflection of a high frequency wave from a sensing circuit that comprises a further FET like structure with a channel next to the channel of the first FET like structure. Preferably, the combination of bias voltages the consecutive second gate electrodes is selected by searching for crossings between lines at predetermined angles in the second two dimensional image. In an embodiment wherein the image values of the second two dimensional image correspond to gradients of the amplitude of a reflection, the crossings are detected by computing position dependent correlations between the second two dimensional image and a pattern comprising crossing lines at the predetermined angles.

The calibration of the first electrode voltage combination may be performed independent of the first electrode voltage combinations. This may involve automatic electrical characterization, that is, a method of automatic measurement of effects of gate electrode voltages on a quantum dot circuit, using a quantum dot circuit that comprises a channel, electrodes that extend over first locations along the edge of the channel, said first gate electrodes each lying between second locations adjacent successive potential wells, the method comprising preforming a scan over combinations of bias voltages of the first gate electrodes at consecutive ones of the first locations, the scan being performed over a two-dimensional range of combinations of the bias voltages of the first gate electrodes at the consecutive ones of the first locations;

measuring current through the channel during said scan;

computing results of applying a two dimensional filtering operation to a two-dimensional image that has the combinations of bias voltages of the first gate electrodes at the consecutive ones of the first locations as image points and measured channel currents as image values;

selecting one of the combinations of the bias voltages of the first gate electrodes at the consecutive ones of the first locations, at which the results produce a maximum response.

In another embodiment, said two dimensional filtering operation has a first image frequency bandwidth for sums of the voltages in the combinations of the bias voltages of the first gate electrodes at the consecutive ones of the first locations, and a second image frequency bandwidth for differences of the voltages in the combinations of the bias voltages of the first gate electrodes at the consecutive ones of the first locations, the second image frequency bandwidth being narrower than the first image frequency bandwidth.

In another embodiment, wherein said two dimensional filtering operation has a first image frequency pass band for sums of the voltages in the combinations of the bias voltages and a low pass filter pass band for differences of the voltages in the combinations of the bias voltages, the first image frequency pass band lying entirely above the low pass filter pass band.

Another embodiment comprises selection of said two-dimensional range by
  measuring the current through the channel during an initial scan of the bias voltages of the first gate electrodes at the consecutive ones of the first locations over an initial two-dimensional range;
  fitting a combination of a first and second straight line to a two dimensional threshold contour in the currents measured during the initial scan;
  computing a combination of values of the first and second voltage where the fitted straight lines intersect; and
  selecting of said two-dimensional range as a range that contains the computed combination, and is narrower than the initial range, the two-dimensional range being scanned at a finer resolution than the initial two-dimensional range.

In embodiments, the selected voltages may subsequently be applied to the first gate electrodes during further use.

The invention claimed is:

1. A method of automatic characterization of a quantum dot circuit for forming a first potential well and a second potential well that succeeds the first potential well in a channel, using first gate electrodes that extend over first locations along an edge of the channel for creating potential barriers next to the first and second potential wells, and second electrodes that extend over second locations along the edge of the channel adjacent to the first and second potential wells for controlling depths of the first and second potential wells in the channel, the second gate electrodes each lying between a respective pair of the first gate electrodes, the method comprising
  performing a pre-scan over combinations of first bias voltages of the first gate electrodes, each for a pair of consecutive ones of the first locations, the pre-scan being performed over a two-dimensional range of combinations of the first bias voltages of the first gate electrodes at the pair of consecutive ones of the first locations;
  measuring current through the channel during said pre-scan, wherein the measuring of current results in a first two-dimensional image that has the bias voltages of the respective ones of the pair of consecutive first gate electrodes as x and y coordinates and measured channel currents as image values at combinations of the bias voltages of the respective ones of the pair of consecutive first gate electrodes;
  applying a two dimensional filtering operation to the first two-dimensional image, wherein said two dimensional filtering operation has a first image frequency pass band with a bandwidth for sums of the voltages in the combinations of the first bias voltages of the first gate electrodes at the consecutive ones of the first locations, and a second image frequency pass band with a bandwidth for differences of the voltages in the combinations of the first bias voltages of the first gate electrodes at the consecutive ones of the first locations, the second image frequency bandwidth being narrower than the first image frequency bandwidth;
  selecting one of the combinations of the first bias voltages of the first gate electrodes at the consecutive ones of the first locations, at which a result of applying the two dimensional filtering operation produces a maximum filter operation output value;
  performing a scan over a combination of second bias voltages applied to the second gate electrodes that extend over consecutive ones of the second locations adjacent to the first and second potential wells, the scan being performed over a two-dimensional range of combinations of said second bias voltages, while applying the selected one of the combinations of voltage values to the first gate electrodes at the consecutive ones of the first locations during said scan over combinations of bias voltages to the second gate electrodes;
  measuring a charge carrier occupation of the first and second potential wells at consecutive positions along the channel during said scan.

2. The method of claim 1, wherein said two dimensional filtering operation has a low pass filter pass band for differences of the voltages in the combinations of the first bias voltages, the first image frequency pass band lying entirely above the low pass filter pass band.

3. The method of claim 1, comprising selection of said further two-dimensional range by
  measuring the current through the channel during an initial scan of the first bias voltages of the first gate electrodes at the consecutive ones of the first locations over an initial two-dimensional range;
  fitting a combination of a first and second straight line to a two dimensional threshold contour in the currents measured during the initial scan;
  computing a combination of values of the first and second voltage where the fitted straight lines intersect; and
  selecting of said further two-dimensional range as a range that contains the computed combination, and is narrower than the initial range, the further two-dimensional range being scanned at a finer resolution than the initial two-dimensional range.

4. The method of claim 1, comprising applying time constant voltages to the second electrodes and the first gate electrodes, if any, other than said consecutive ones of the further electrodes during said scanning over the further two-dimensional range.

5. The method of claim 4, wherein the time constant voltage for at least one electrode from the first gate electrodes and the second gate electrodes is determined in a pre-selection step before said scanning of first bias voltages by
  varying the voltage on the at least one of the second gate electrodes and the first gate electrodes individually;
  measuring the current through the channel at different levels of the voltage on said at least one of the second gate electrodes and the first gate electrodes;
  selecting the time constant voltage as a voltage on said at least one of the second gate electrodes and the first gate electrodes at which the measured current through the channel reaches a predetermined fraction of a saturation current through the channel.

6. The method of claim 1, comprising detecting an image point that corresponds to a match between a pattern of crossing edges along predetermined directions in a further two-dimensional image that has the combinations of the second bias voltages as image points and the charge carrier occupation as image values.

7. The method of claim 6, wherein the predetermined directions of the crossing edges are determined by computing lines of combinations of the voltages of the second gate electrodes which result in equal lowest potential values in potential wells next to the second gate electrodes that extend over the consecutive ones of the second locations adjacent to the potential wells, in a simulation of operation of the quantum dot circuit.

8. The method of claim 1, wherein said scanning of first bias voltages of the second gate electrodes comprises applying triangularly swept voltages to at least one of the second gate electrodes.

9. The method of claim 1, wherein said quantum dot circuit comprises a sensing circuit that comprises a further channel adjacent to said channel, the method comprising measuring the charge carrier occupation of the first and second potential wells by transmitting an electromagnetic wave through the further channel;

measuring a reflection of the transmitted electromagnetic wave through the further channel.

10. A quantum dot circuit for forming a first potential well and a second potential well that succeeds the first potential well in a channel, comprising the channel;

first gate electrodes that extend over first locations along the edge of the channel for creating potential barriers next to the potential wells;

second gate electrodes that extend over successive second locations along the edge of the channel, for controlling depths of the first and second potential wells in the channel, said second gate electrodes each lying between a respective pair of the first gate electrodes;

a controllable bias voltage generation circuit with first outputs coupled to the first gate electrodes and second outputs coupled to the second gate electrodes;

a calibration circuit configured to, under control of execution of a program in a computer, cause the bias voltage generation circuit to perform a pre-scan of first bias voltages of the first gate electrodes at consecutive ones of the first locations over a first two-dimensional range of combinations of said first bias voltages;

read measurements of a current through the channel from the current detector during the pre-scan, the measurements resulting in a first two-dimensional image that has the bias voltages of the respective ones of the pair of consecutive first gate electrodes as x and y coordinates and measured channel currents as image values at combinations of the bias voltages of the respective ones of the pair of consecutive first gate electrodes;

compute results of applying a two dimensional filtering operation to the two-dimensional image, wherein said two dimensional filtering operation has a first image frequency pass band with a bandwidth for sums of the voltages in the combinations of the first bias voltages of the first gate electrodes at the consecutive ones of the first locations, and a second image frequency pass band with a bandwidth for differences of the voltages in the combinations of the first bias voltages of the first gate electrodes at the consecutive ones of the first locations, the second image frequency bandwidth being narrower than the first image frequency bandwidth;

select one of the combinations of the first bias voltages the first gate electrodes at consecutive ones of the first locations at which the results produce a maximum filter operation output value, cause the bias voltage generation circuit to perform a scan comprising scanning second bias voltages applied to respective ones of the second gate electrodes that extend over consecutive ones of the second locations over a two-dimensional range of combinations of said second bias voltages, while applying the selected one of the combinations of the first bias voltages of the first gate electrodes at the consecutive ones of the first locations;

obtain measured charge carrier occupations of the first and second potential wells at consecutive positions along the channel during said scan.

11. The quantum dot circuit of claim 10, wherein said two dimensional filtering operation has a first image frequency bandwidth for sums of the voltages in the combinations of first bias voltages of the first gate electrodes at the consecutive ones of the first locations and a second image frequency bandwidth for differences of the voltages in the combinations of the first bias voltages of the first gate electrodes at the consecutive ones of the first locations, the second image frequency bandwidth being narrower than the first image frequency bandwidth.

12. The quantum dot circuit according to claim 10, wherein the calibration circuit configured to detect a location of a match between a pattern of crossing edges along predetermined directions and a two-dimensional image that has the combinations of second bias voltages as image points and the charge carrier occupation as image values.

13. The quantum dot circuit according to claim 10, comprising a sensing circuit that comprises a further channel adjacent to said channel;

a high frequency signal generator coupled to the further channel;

a high frequency signal detector coupled to the further channel; wherein the calibration circuit is configured to, under control of execution of the program in a computer cause the high frequency signal generator to transmit an electromagnetic wave through the further channel, obtain a measurement of a detected electromagnetic wave reflection from the high frequency signal detector;

use the measurement of a detected electromagnetic wave reflection to measure the charge carrier occupation.

14. The quantum dot circuit of claim 10, wherein the calibration circuit is configured to select said further two-dimensional range by causing the bias voltage generation circuit to perform an initial scan of first bias voltages of the first gate electrodes at the consecutive ones of the first locations;

reading measurements of a current through the channel from the current detector during the initial scan;

fitting a combination of a first and second straight line to a two dimensional threshold contour in the currents measured during the initial scan;

computing a combination of values of the first and second voltage where the fitted straight lines intersect; and selecting of said further two-dimensional range as a range that contains the computed combination, and is narrower than the initial range, causing the bias voltage generation circuit to perform said pre-scan over the selected further two-dimensional range at a finer resolution than in the initial two-dimensional range.

15. The quantum dot circuit of claim 10, wherein the calibration circuit is configured to cause the bias voltage generation circuit to apply time constant voltages to the second gate electrodes and the first gate electrodes, if any, other than said consecutive one of the first gate electrodes during said pre-scan.

16. The quantum dot circuit of claim 15, wherein the calibration circuit is configured to select the time constant voltage for at least one of the second gate electrodes and the first gate electrodes in a pre-selection step before said pre-scan by
  causing the bias voltage generation circuit to vary the voltage on the at least one of the second gate electrodes and the first gate electrodes individually;
  obtaining measurements of the current from the current detector at different levels of the voltage on said at least one of the second gate electrodes and the first gate electrodes;
  selecting a voltage on said at least one of the second gate electrodes and the first gate electrodes at which the measured current through the channel reaches a predetermined fraction of a saturation current through the channel.

17. A method of automatic characterization of a quantum dot circuit for forming a first potential well and a second potential well in a channel, using first gate electrodes that extend over first locations along an edge of the channel for creating potential barriers next to the first and second potential wells, and second electrodes that extend over second locations along the edge of the channel adjacent to the first and second potential wells for controlling depths of the first and second potential wells in the channel, the second gate electrodes each lying between a respective pair of the first gate electrodes, the method comprising
  simulating operation of the quantum dot circuit;
  computing directions of lines of combinations of the voltages of the second gate electrodes which result in equal lowest potential values in the first and second potential wells next to the second gate electrodes that extend over the consecutive ones of the second locations adjacent to the potential wells, during said simulating;
  performing a scan over combinations of bias voltages applied to gate electrodes that extend over consecutive ones of the second locations, the scan being performed over a two-dimensional range of combinations of said bias voltages
  measuring a charge carrier occupation of the first and second potential wells at consecutive positions along the channel during said scan;
  detecting an image point where a match occurs with a pattern of crossing edges along the computed directions in a two-dimensional image that has the combinations of the bias voltages as image points and the charge carrier occupation as image values.

* * * * *